United States Patent
Park et al.

(10) Patent No.: US 9,831,415 B2
(45) Date of Patent: Nov. 28, 2017

(54) PIEZOELECTRIC VIBRATION MODULE

(71) Applicant: SAMSUNG ELECTRO-MECHANICS CO., LTD., Gyeonggi-Do (KR)

(72) Inventors: Dong Sun Park, Gyeonggi-Do (KR); Jung Hyun Park, Gyeonggi-Do (KR); Jong Woo Hong, Gyeonggi-Do (KR); Dong Woohn Kim, Gyeonggi-Do (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 435 days.

(21) Appl. No.: 14/575,701

(22) Filed: Dec. 18, 2014

(65) Prior Publication Data
US 2015/0194593 A1    Jul. 9, 2015

(30) Foreign Application Priority Data
Jan. 8, 2014    (KR) .................. 10-2014-0002480

(51) Int. Cl.
| | | |
|---|---|---|
| *H01L 41/09* | (2006.01) | |
| *B06B 1/06* | (2006.01) | |
| *B06B 1/14* | (2006.01) | |

(52) U.S. Cl.
CPC ........ *H01L 41/0933* (2013.01); *B06B 1/0648* (2013.01); *B06B 1/14* (2013.01)

(58) Field of Classification Search
CPC .............................. B06B 1/0648; B06B 1/14
USPC ........... 310/311, 323.01, 328, 329, 339, 354

IPC .................. H01L 41/09, 41/053, 41/25
See application file for complete search history.

(56) References Cited

U.S. PATENT DOCUMENTS

| 9,225,265 | B2 * | 12/2015 | Oh | ............ B06B 1/0644 |
|---|---|---|---|---|
| 2013/0020910 | A1 * | 1/2013 | Ogawa | ............ H01L 41/1136 |
| | | | | 310/339 |
| 2013/0038175 | A1 * | 2/2013 | Ogawa | ............ B81B 3/0078 |
| | | | | 310/330 |
| 2014/0152148 | A1 * | 6/2014 | Oh | ............ G06F 3/016 |
| | | | | 310/321 |
| 2015/0055006 | A1 * | 2/2015 | Kim | ............ H04N 5/23293 |
| | | | | 348/333.11 |
| 2015/0333699 | A1 * | 11/2015 | Kim | ............ G06F 3/041 |
| | | | | 310/323.01 |

FOREIGN PATENT DOCUMENTS

JP    2-94486    7/1990

* cited by examiner

*Primary Examiner* — Thomas Dougherty
*Assistant Examiner* — Karen B Addison
(74) *Attorney, Agent, or Firm* — LRK Patent Law Firm

(57) ABSTRACT

Embodiments of the invention provide a piezoelectric vibration module, including a vibration plate mounted with a piezoelectric element, which generates a vibration force in a vertical direction by being repeatedly expanded and contracted depending on external power applied thereto, and a lower case coupled with both ends of the vibration plate so as to be spaced apart from the vibration plate. The piezoelectric vibration module further includes a bar-shaped weight body increasing the vibration force of the piezoelectric element, and an elastic member interposed between the vibration plate and the weight body.

14 Claims, 4 Drawing Sheets

PIEZOELECTRIC VIBRATION MODULE

CROSS REFERENCE TO RELATED APPLICATION

This application claims the benefit of and priority under 35 U.S.C. §119 to Korean Patent Application No. KR 10-2014-0002480, entitled "PIEZOELECTRIC VIBRATION MODULE," filed on Jan. 8, 2014, which is hereby incorporated by reference in its entirety into this application.

BACKGROUND

Field of the Invention

The present invention relates to a piezoelectric vibration module.

Description of the Related Art

Generally, in portable electronic devices, such as a portable phone, an e-book terminal, a game machine, a portable multimedia player (PMP), as non-limiting examples, a vibration function has been utilized for various applications.

In particular, a vibration generating apparatus for generating the vibration has been mainly equipped in the portable electronic device to be used as an alert function that is a soundless receiving signal.

To keep pace with multi-functionalization of the portable electronic device, a demand for a miniaturized, integrated, and multi-functional vibration generating apparatus is being increased.

Further, to meet the recent demand of users to simply use the portable electronic device, a touch type device performing an input by touching the portable electronic device has been generally adopted.

A concept of a currently generally used haptic device widely includes a concept of reflecting intuitive experience of an interface user and diversifying feedback for a touch, in addition to a concept of performing an input through a touch.

The haptic device generally provides vibrations by repeatedly expanding and/or contracting a piezoelectric element by external power applied thereto. In an ultrasonic linear motor described, for example, in Japanese U.M. Laid-Open Publication No. H2-94486, the piezoelectric element may improve moisture proof and durability.

In the ultrasonic linear motor described in the Japanese U.M. Laid-Open Publication No. H2-94486, a circumference of the piezoelectric element is enclosed with a protective material, for example, silicon rubber so as to improve performance and lifespan of the piezoelectric element under the environment that humidity is high or a considerable amount of dust is generated, such that a collision of a plurality of components configuring the ultrasonic linear motor with the piezoelectric element may be prevented beforehand.

However, the whole portion except for a portion of the piezoelectric element generating a vibration force by a translational motion of the ultrasonic linear motor described in the Japanese U.M. Laid-Open Publication No. H2-94486 is enclosed with the protective material, and thus the expansion or contraction deformation rate of the piezoelectric element cannot but remarkably be reduced.

Thus, according to the conventional art, the protective material may rather act as a factor to reduce the vibration force of the piezoelectric element, and therefore other methods for protecting the piezoelectric element from external factors need to be considered.

SUMMARY

Accordingly, embodiments of the invention have been made to provide a piezoelectric vibration module capable of protecting a piezoelectric element by reducing an impact between a weight body and a vibration plate due to an external impact such as falling.

According to at least one embodiment, a piezoelectric vibration module includes an upper case having a lower surface opened and forming an inner space, a lower case coupled with the lower surface of the upper case to shield the inner space of the upper case, a vibration plate mounted with a piezoelectric element which generates a vibration force by being repeatedly expanded and contracted depending on external power applied thereto and disposed in the upper case and the lower case to be driven vertically, a bar-shaped weight body increasing a vibration force of the piezoelectric element, and an elastic member interposed between the vibration plate and the weight body.

According to at least one embodiment, the elastic member is formed of a coil spring.

According to at least one embodiment, the elastic member is made of a material having spring stiffness larger than that of the vibration plate. According to at least one embodiment, since the elastic member does not suffer from a tensile and/or compression deformation at a vibration, which is equal to or less than a specific numerical value and thus is additionally not deformed, the elastic member supports the vibration plate and the weight body while constantly maintaining a spaced distance between the vibration plate and the weight body.

According to at least one embodiment, the elastic member is disposed between the weight body and the vibration plate, mounted on the upper surface of the vibration plate.

According to at least one embodiment, the elastic member is positioned at a central portion of an upper surface of the vibration plate.

According to at least one embodiment, the piezoelectric element is mounted on the lower surface of the vibration plate, mounted at a central portion of the lower surface of the vibration plate.

According to at least one embodiment, in order to secure a displacement of a flexural vibration, the vibration plate and the lower case are disposed to be spaced apart from each other at a predetermined interval.

According to at least one embodiment, at least two elastic members, preferably, two elastic members are disposed between the weight body and the vibration plate.

According to at least one embodiment, the at least two elastic members are arranged to be bilaterally symmetrical at the central portion of the vibration plate.

According to at least one embodiment, the at least two elastic members are arranged to be bilaterally symmetrical at the central portion of the weight body.

Various objects, advantages and features of the invention will become apparent from the following description of embodiments with reference to the accompanying drawings.

BRIEF DESCRIPTION OF DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

DETAILED DESCRIPTION

Figure 1:
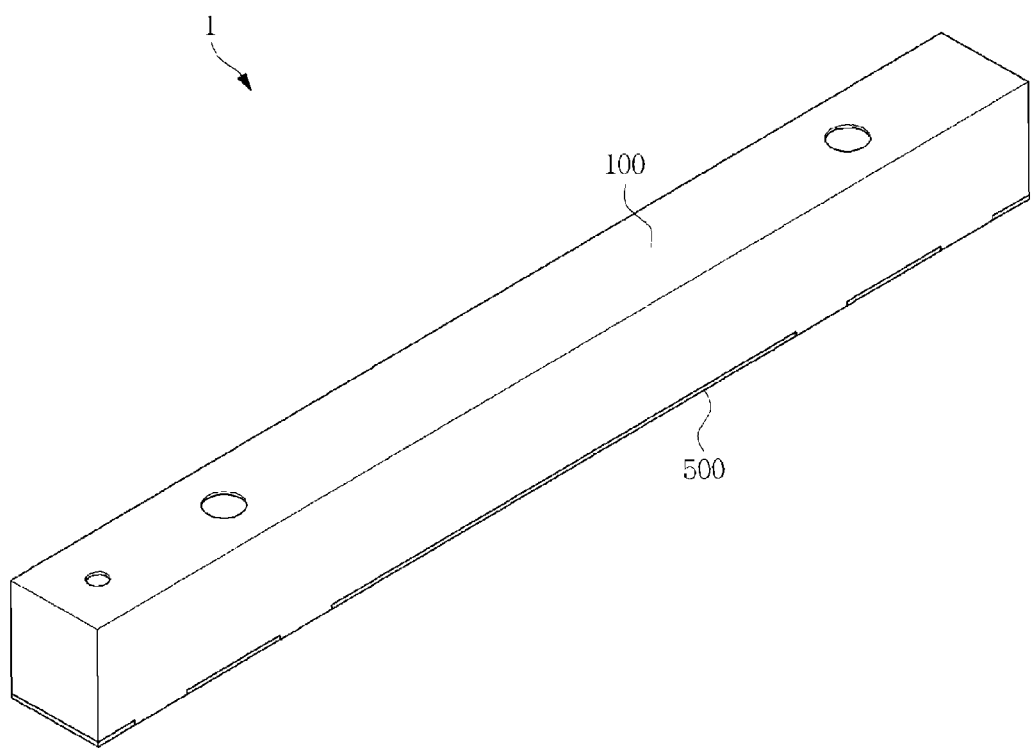
FIG. 1 is a perspective view of a piezoelectric vibration module according to an embodiment of the invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Like reference numerals refer to like elements throughout the specification.

Hereinafter, a piezoelectric vibration module according to various embodiments of the invention will be described in detail with reference to the accompanying drawings.

Figure 2:
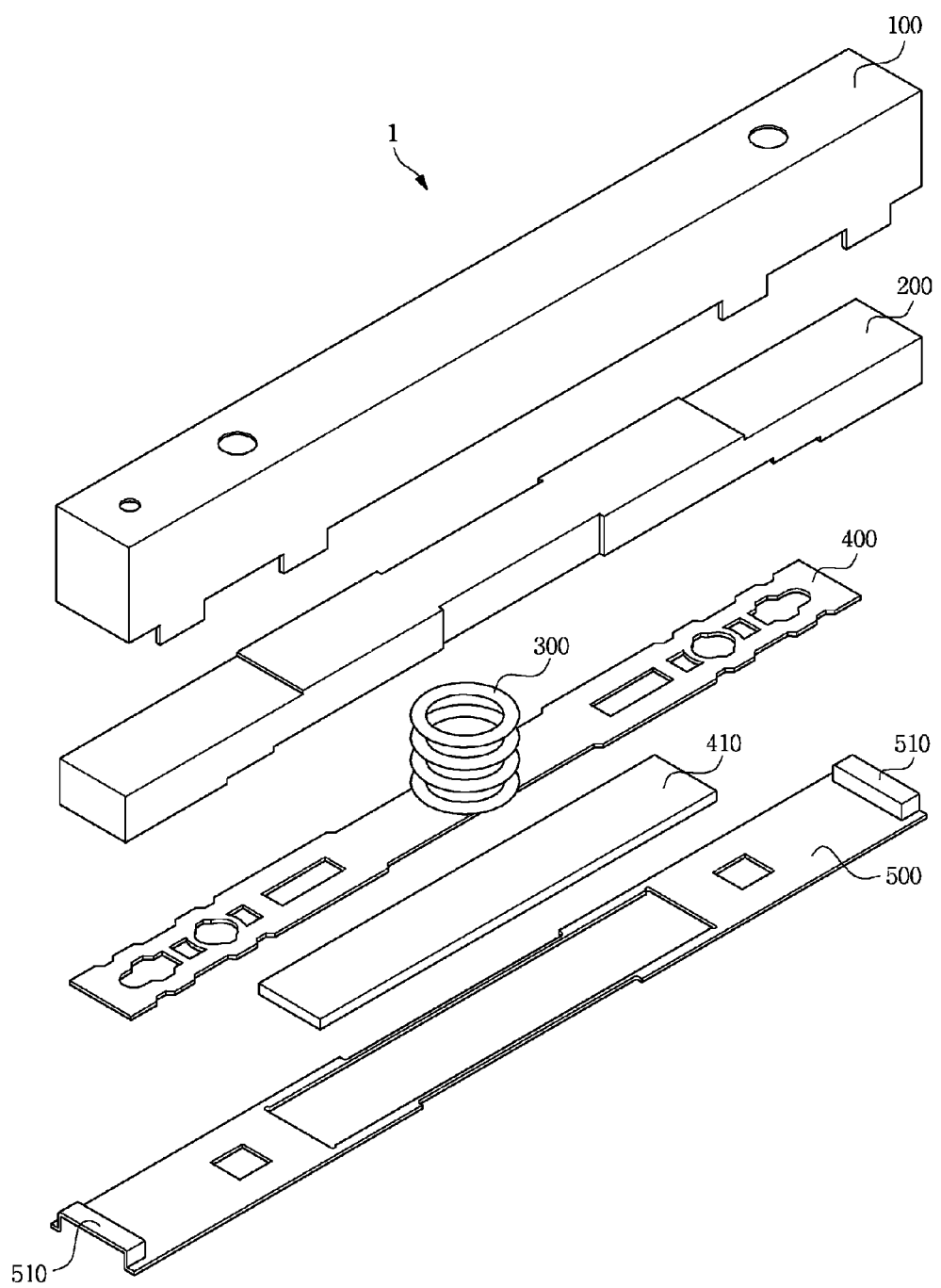
FIG. 2 is an exploded perspective view of a piezoelectric vibration module illustrated in FIG. 1 according to an embodiment of the invention.

FIG. 1 is a perspective view of a piezoelectric vibration module 1 according to an embodiment of the invention, and FIG. 2 is an exploded perspective view of the piezoelectric vibration module 1 illustrated in FIG. 1 according to an embodiment of the invention.

According to at least one embodiment, there is provided a piezoelectric vibration module 1, which may deliver vibration force of a piezoelectric element 410 by repeatedly expanding and/or contracting the piezoelectric element 410 to external parts.

As illustrated in FIG. 1, the piezoelectric vibration module 1 according to at least one embodiment is configured to include an upper case 100, a weight body 200, an elastic member 300, a vibration plate 400 on which the piezoelectric element 410 is mounted, and a lower case 500, in which the piezoelectric vibration module 1 having the above configuration is used as a means to deliver the vibration force to, for example, a touch screen panel, as a non-limiting example.

According to at least one embodiment, the upper case 100 has a box shape of which the one side is opened and is formed at a size enough to have a driving body, thus, the vibration plate 400 on which the piezoelectric element 410 is mounted and the weight body 200 increasing the vibration force received in an inner space thereof.

According to at least one embodiment, the vibration plate 400 has an elongated plate shape to mount the piezoelectric element 410. According to at least one embodiment, preferably the piezoelectric element 410 is disposed on a lower surface of the vibration plate 400, more preferably, at a central portion of the lower surface of the vibration plate 400. In addition, the weight body 200 is mounted or disposed at a predetermined interval from an upper surface of the vibration plate 400. According to at least one embodiment, the vibration plate 400 includes a printed circuit board (PCB) (not illustrated) applying power for driving the piezoelectric element 410.

According to at least one embodiment, the vibration plate 400 includes the elastic member 300 erected upward on an upper surface thereof. Specifically, the elastic member 300 is coupled with a central portion of the upper surface of the vibration plate 400. The elastic member 300 and the vibration plate 400 are fixedly bonded with each other by various schemes such as welding.

According to at least one embodiment, the vibration plate 400 is made of a metal material having an elastic force, for example, SUS, so that it may be deformed integrally with the piezoelectric element 410 that is repeatedly expanded and contracted by external power applied thereto. Further, when the vibration plate 400 and the piezoelectric element 410 are coupled with each other by a bonding method, the vibration plate 400 and the piezoelectric element 410 are also made of an invar that is a material having a coefficient of thermal expansion similar to that of the piezoelectric element in order to previously prevent a bending phenomenon that may occur due to the hardening of a bonding member.

Further, according to at least one embodiment, the vibration plate 400 is made of the invar that is a material having a coefficient of thermal expansion similar to that of the piezoelectric element 410. Therefore, since a thermal stress occurring when the piezoelectric element 410 is operated or is applied with a thermal impact even under a high temperature external environment decreases, the piezoelectric element 410 has an effect of preventing a piezoelectric deterioration phenomenon that electrical characteristics deteriorate.

According to at least one embodiment, the vibration plate 400 is spaced apart from the lower case 500 at a predetermined interval in parallel. Preferably, the lower case 500 has both ends provided with stepped portions 510. The vibration plate 400 is fixedly coupled on the stepped portion 510 of the lower case 500. The stepped portion 510 provides a space between the vibration plate 400 and the lower case 500.

According to at least one embodiment, when power is applied to the piezoelectric element 410, the piezoelectric element 410 is completely attached to the vibration plate 400 and thus is expanded or contracted to generate a moment at the central portion of the vibration plate 400. Since the moment is generated in the state in which the vibration plate 400 is fixed to both ends of the lower case 500, thus, the stepped portions 510, the central portion of the vibration plate 400 has an arch shape and moves vertically. Therefore, according to at least one embodiment of the invention, to increase a moving width of the vibration plate 400, the piezoelectric element 410 and the elastic member 300 are disposed at the central portion of the vibration plate 400. As known well, the piezoelectric element 410 may be stacked in a single layer form or a multilayer form. According to at least one embodiment, the piezoelectric element stacked in the multilayer form secures an electric field required to drive the piezoelectric element even in a low external voltage. Therefore, it is possible to lower a driving voltage of the piezoelectric vibration module 1 according to at least one embodiment of the invention, and therefore, the piezoelectric element stacked in the multilayer form may be preferably adopted.

Figure 3:
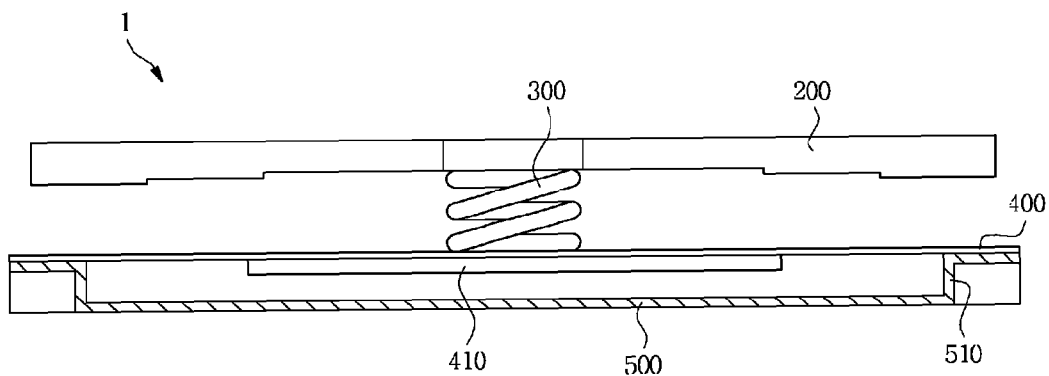
FIG. 3 is a front view schematically illustrating the piezoelectric vibration module according to an embodiment of the invention, with an exception for an upper case.

According to at least one embodiment, at least one elastic member 300 is interposed between the weight body 200 and the vibration plate 400. The elastic member 300 supports the weight body 200 on the vibration plate 400. FIGS. 2 and 3 illustrate that one elastic member 300 is disposed at the central portion of the upper surface of the vibration plate 400 in consideration of a displacement of amplitude of the vibration plate 400 together with a center of gravity of the weight body 200. Here, the weight body 200 is a medium having a bar shape to maximally increase the vibration force. The weight body 200 may be made of a metal material, preferably, a tungsten material having a relatively higher density in the same volume. Further, in order to prevent the weight body 200 from unnecessarily colliding with both ends of the vibration plate 400, the weight body 200 is formed to be inclined upward from the central portion of the weight body 200 toward both ends. In addition, in the piezoelectric vibration module 1 according to at least one embodiment, the upper case 100 is disposed to be spaced apart from an upper portion of the weight body 200 to prevent the vibration plate 400 of the piezoelectric vibration module 1 from contacting or colliding with an inner side of the upper portion of the upper case 100 of the weight body 200 while the vibration plate 400 suffers from a driving displacement to be bent upward.

As described above, since the elastic member 300 is positioned on the upper surface of the vibration plate 400, the piezoelectric element 410 is disposed on the flat lower surface of the vibration plate 400. When the piezoelectric element 410 suffers from a flexural vibration in a vertical direction of the vibration plate 400, it is possible to previously prevent the piezoelectric element 410 from contacting with the weight body 200 or the elastic member 300.

According to at least one embodiment, the elastic member 300 is made of a stiff material so that it is not almost elastically deformed, and therefore serves as a spacer to constantly maintain a spaced distance between the weight body 200 and the vibration plate 400 despite a change in amplitude of the vibration plate 400 due to the flexural vibration of the piezoelectric element 410 in the vertical direction. Therefore, the elastic member 300 according to at least one embodiment of the invention needs to be made of a material having spring stiffness k larger than that of the vibration plate 400.

According to at least one embodiment, when the piezoelectric vibration module 1 falls and collides unexpectedly, a considerable external force is applied to the piezoelectric vibration module 1. In this case, according to at least one embodiment, the upper case 100 collides with the weight body 200 and a falling impact force is delivered to the vibration plate 400 including the piezoelectric element 410 as it is. Therefore, the falling impact force more bends the vibration plate 400 and thus cracks occur in the piezoelectric element 410. The elastic member 300 according to at least one embodiment is formed in a coil spring, which has spring stiffness to be deformed only in a predetermined impact amount or more and perform an impact absorbing action to reduce the falling impact. As described above, the coil spring suffers from a tensile and/or compression deformation when the vibration of the predetermined impact amount or more such as falling is applied to prevent an abnormal flexural phenomenon of the vibration plate 400 and remarkably reduce the impact strength delivered to the piezoelectric element 410, thereby reducing the occurrence of cracks.

According to at least one embodiment, the lower case 500 is formed of a plate having an elongated flat shape as illustrated and is formed to have a size and a shape which may close an opened lower surface of the upper case 100.

According to at least one embodiment, the upper case 100 and the lower case 500 are coupled to each other in various schemes, such as a caulking scheme, a welding scheme, a bonding scheme, as non-limiting examples of conventional techniques known to those skilled in the art.

Figure 4A:
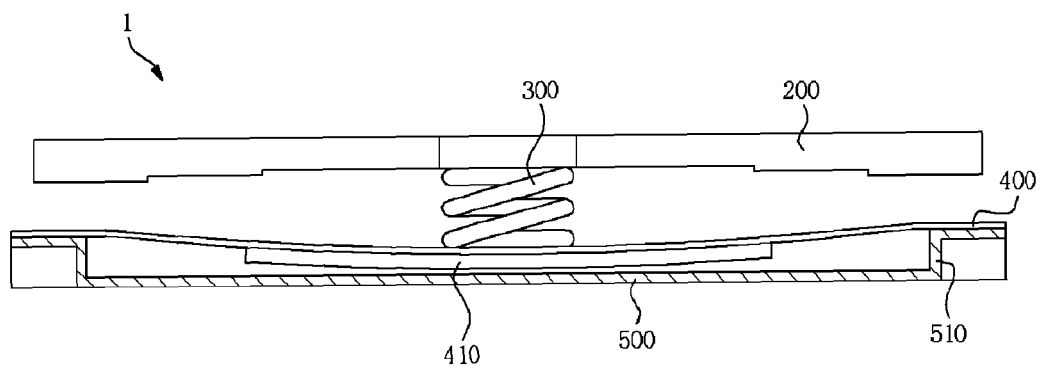
FIGS. 4A and 4B are diagrams illustrating a driving process of the piezoelectric vibration module illustrated in FIG. 3 according to an embodiment of the invention.
Figure 4B:
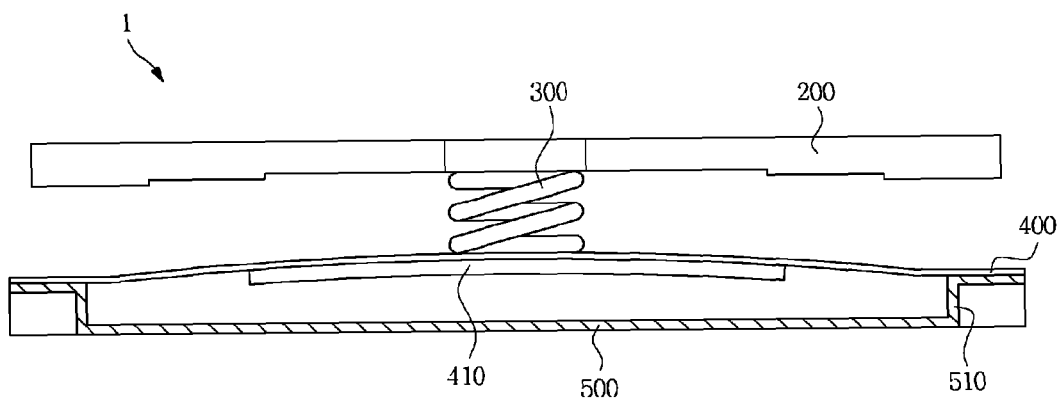
Figure 4C:
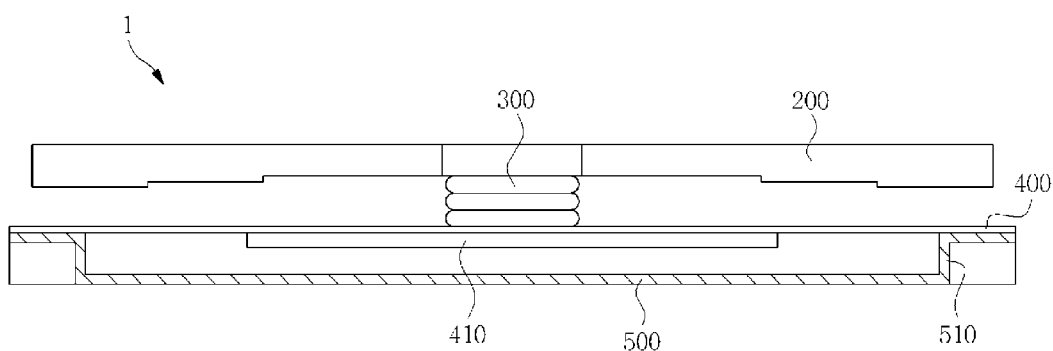
FIG. 4C is a diagram illustrating an operation state of the piezoelectric vibration module of FIG. 3 when an abnormal impact is applied according to an embodiment of the invention.

FIGS. 4A and 4B illustrate a normal driving state of the piezoelectric vibration module 1 illustrated in FIG. 3 according to an embodiment of the invention, and FIG. 4C is a diagram illustrating the operation state of the piezoelectric vibration module 1, when an impact is applied to the piezoelectric vibration module 1, for example, the piezoelectric vibration module 1 falls, according to an embodiment of the invention.

FIG. 4A is a front view of the piezoelectric vibration module 1 in which a length of the piezoelectric element 410 is expanded at the time of applying power thereto. When the length of the piezoelectric element 410 is long, the vibration plate 400 has a relatively small deformation rate and the vibration plate 400 is fixed to the lower case 500, and therefore the vibration plate 400 is driven to be bent downward. When the piezoelectric element 410 is expanded and the vibration plate 400 suffers from the flexural vibration, the elastic member 300 has the spring stiffness larger than that of the vibration plate 400 and therefore does not suffer from the tensile and/or compression deformation to prevent the vibration plate 400 from colliding with the weight body 200 while maintaining the flexural vibration of the vibration plate 400.

FIG. 4B is a front view of the piezoelectric vibration module 1 in which the length of the piezoelectric element 410 is contracted at the time of applying power thereto. When the length of the piezoelectric element 410 is reduced, the vibration plate 400 is driven to be bent upward. When the piezoelectric element 410 is contracted and the vibration plate 400 suffers from the flexural vibration, the elastic member 300 has the spring stiffness larger than that of the vibration plate 400 and therefore the elastic member 300 itself is not deformed to previously prevent the vibration plate 400 from colliding with the weight body 200 while maintaining the flexural vibration of the vibration plate 400.

Unlike this, FIG. 4C is a front view of the piezoelectric vibration module 1 in which an external force is applied to the weight body 200. When the external force applied to the weight body 200, for example, the falling impact force is delivered to the elastic member 300, the piezoelectric vibration module 1 reduces the falling impact force by the compression deformation or the tensile deformation of the elastic member 300 to deliver only a minimum external force to the vibration plate 400. Therefore, the vibration plate 400 reduces an abnormal warpage phenomenon due to the falling impact force.

Figure 5:
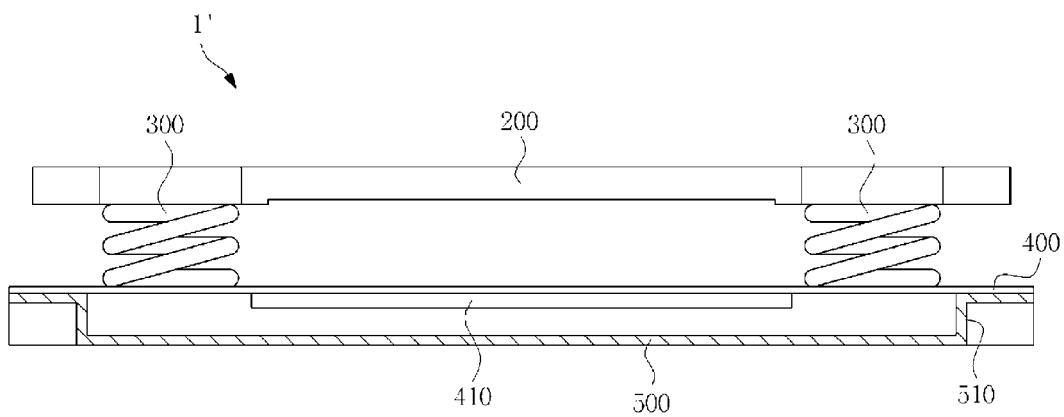
FIG. 5 is a front view schematically illustrating a piezoelectric vibration module according to another embodiment of the invention, with an exception for an upper case.

FIG. 5 is a diagram schematically illustrating a piezoelectric vibration module according to another embodiment of the invention, and is a front view of the piezoelectric vibration module 1 from which the upper case is separated.

According to at least one embodiment, a piezoelectric vibration module 1' according to another embodiment of the invention has a very similar structure to the piezoelectric vibration module 1 illustrated in FIGS. 2 and 3, except for the number and arrangement position of elastic members 300 in the piezoelectric vibration module 1, and therefore to help a clear understanding of the various embodiments of the invention, the description of the same or like components will be omitted.

As illustrated, the piezoelectric vibration module 1' according to another embodiment of the invention includes two elastic members 300 erected vertically on the upper surface of the vibration plate 400. Although FIG. 5 illustrates only the two elastic members 300 but the number of elastic members 300 is not limited thereto, and therefore it is to be noted that at least three elastic members may be mounted.

As illustrated, the piezoelectric vibration module 1' according to another embodiment of the invention is mounted with the two elastic members 300, which support both ends of the weight body 200 to be spaced apart from the vibration plate 400 at a predetermined interval, thereby preventing both ends of the weight body 200 from contacting with the vibration plate 400 at the time of a vertical movement of the weight body 200 by the expansion and contraction deformation of the piezoelectric element 410. In the piezoelectric vibration module 1 illustrated in FIG. 2, the weight body 200 causes an unexpected collision with the upper case and/or the vibration plate 400 when a displacement direction of both ends of the weight body 200 is different based on the elastic member 300 like a seesaw as a central point.

To solve the above problem, in the piezoelectric vibration module 1' according to another embodiment of the invention, the elastic members 300 are arranged to be bilaterally symmetrical at the central portions of the vibration plate 400 and the weight body 200. Therefore, the arrangement of the elastic members certainly prevent the weight body 200 from directly colliding with the vibration plate 400.

As set forth above, according to various embodiments of the invention, it is possible to provide the piezoelectric vibration module, which may be used for a long period of time, by protecting the piezoelectric element providing the vibration force from an external impact force.

In particular, according to various embodiments of the invention, it is possible to protect the piezoelectric element without affecting the vibration force generated due to the activation of the piezoelectric element, by adopting the elastic member having high spring stiffness.

In addition, according to various embodiments of the invention, it is possible to provide the assembling convenience by simplifying the coupling relationship between the vibration plate mounted with the piezoelectric element and the weight body increasing the vibration force Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the present invention may suitably comprise, consist or consist essentially of the elements disclosed and may be practiced in the absence of an element not disclosed. For example, it can be recognized by those skilled in the art that certain steps can be combined into a single step.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a," "an," and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

Ranges may be expressed herein as from about one particular value, and/or to about another particular value. When such a range is expressed, it is to be understood that another embodiment is from the one particular value and/or to the other particular value, along with all combinations within said range.

Although the present invention has been described in detail, it should be understood that various changes, substitutions, and alterations can be made hereupon without departing from the principle and scope of the invention. Accordingly, the scope of the present invention should be determined by the following claims and their appropriate legal equivalents.

What is claimed is:

1. A piezoelectric vibration module, comprising:
    a vibration plate mounted with a piezoelectric element which generates a vibration force in a vertical direction by being repeatedly expanded and contracted depending on external power applied thereto;
    a lower case coupled with both ends of the vibration plate so as to be spaced apart from the vibration plate;
    a bar-shaped weight body increasing the vibration force of the piezoelectric element; and
    an elastic member interposed between the vibration plate and the weight body.

2. The piezoelectric vibration module of claim 1, wherein the elastic member is formed of a coil spring.

3. The piezoelectric vibration module of claim 1, wherein the elastic member is made of a material having spring stiffness larger than that of the vibration plate.

4. The piezoelectric vibration module of claim 1, wherein the elastic member is mounted on an upper surface of the vibration plate.

5. The piezoelectric vibration module of claim 1, wherein the elastic member is positioned at a central portion of an upper surface of the vibration plate.

6. The piezoelectric vibration module of claim 1, wherein a lower plate has both ends each provided with stepped portions.

7. The piezoelectric vibration module of claim 1, wherein the piezoelectric element is mounted on a lower surface of the vibration plate.

8. The piezoelectric vibration module of claim 1, wherein the piezoelectric element is mounted on a central portion of a lower surface of the vibration plate.

9. The piezoelectric vibration module of claim 1, further comprising:
    an upper case having one side opened and formed with an inner space.

10. The piezoelectric vibration module of claim 9, wherein the lower case is coupled with the opened one side of the upper case to shield the inner space of the upper case.

11. The piezoelectric vibration module of claim 9, wherein a lower surface of the upper case is opened.

12. The piezoelectric vibration module of claim 1, further comprising:
    at least two elastic members.

13. The piezoelectric vibration module of claim 12, wherein the at least two elastic members are arranged to be bilaterally symmetrical at a central portion of the vibration plate.

14. The piezoelectric vibration module of claim 12, wherein the at least two elastic members are arranged to be bilaterally symmetrical at a central portion of the weight body.

* * * * *